(12) United States Patent
Lee et al.

(10) Patent No.: US 11,950,465 B2
(45) Date of Patent: Apr. 2, 2024

(54) DISPLAY DEVICE WITH ALTERNATING POWER AND DATA LINES

(71) Applicant: SAMSUNG DISPLAY CO., LTD., Yongin-si (KR)

(72) Inventors: Bongwon Lee, Yongin-si (KR); Hyunchol Bang, Yongin-si (KR); Youngsoo Yoon, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 153 days.

(21) Appl. No.: 17/351,683

(22) Filed: Jun. 18, 2021

(65) Prior Publication Data

US 2022/0181423 A1    Jun. 9, 2022

(30) Foreign Application Priority Data

Dec. 4, 2020    (KR) .......................... 10-2020-0168717

(51) Int. Cl.
*H10K 59/12*    (2023.01)
*H10K 59/131*    (2023.01)

(52) U.S. Cl.
CPC .................................. *H10K 59/131* (2023.02)

(58) Field of Classification Search
CPC ............... H01L 27/3276; H01L 27/124; H01L 27/3244; H01L 51/0097; H01L 27/32; G06F 1/1637; G06F 1/1652; H10K 59/131; H10K 59/12; H10K 77/111; Y02E 10/549
USPC ......................................................... 257/40
See application file for complete search history.

(56) References Cited

U.S. PATENT DOCUMENTS

| | | | |
|---|---|---|---|
| 9,214,509 B2 | 12/2015 | Park et al. | |
| 10,304,862 B2* | 5/2019 | Ka | G09G 3/325 |
| 10,784,316 B2 | 9/2020 | Lee et al. | |
| 2002/0024493 A1* | 2/2002 | Ozawa | G09G 3/3233 |
| | | | 345/92 |
| 2005/0186839 A1* | 8/2005 | Matsueda | H10K 59/131 |
| | | | 439/577 |
| 2016/0307937 A1* | 10/2016 | Jin | H01L 27/124 |
| 2017/0287394 A1* | 10/2017 | Kim | H10K 59/131 |
| 2017/0287936 A1* | 10/2017 | Kim | H01L 27/124 |
| 2017/0287937 A1* | 10/2017 | Ka | H01L 27/1244 |
| 2017/0330928 A1* | 11/2017 | Choi | H01L 27/1255 |
| 2018/0175077 A1* | 6/2018 | Koo | H10K 59/126 |
| 2020/0044006 A1 | 2/2020 | Lee et al. | |

(Continued)

FOREIGN PATENT DOCUMENTS

| | | | |
|---|---|---|---|
| CN | 111682031 A | * | 9/2020 |
| EP | 3660824 A1 | | 6/2020 |
| KR | 1020140141192 A | | 12/2014 |

(Continued)

*Primary Examiner* — Didarul A Mazumder
(74) *Attorney, Agent, or Firm* — CANTOR COLBURN LLP (57) ABSTRACT

A display device includes: a substrate including a display area and a peripheral area outside the display area; a power wiring portion including a first power line in the peripheral area, a second power line spaced apart from the first power line and closer to the display area than the first power line, and connection power lines connecting the first power line to the second power line; and data lines in the peripheral area and having portions located between the connection power lines when viewed from a direction perpendicular to the substrate.

20 Claims, 11 Drawing Sheets

(56) References Cited

U.S. PATENT DOCUMENTS

2020/0176542 A1  6/2020  Park et al.

FOREIGN PATENT DOCUMENTS

| KR | 1020190090417 A | 8/2019 |
| KR | 1020200015868 A | 2/2020 |
| KR | 1020200039272 A | 4/2020 |
| KR | 1020200066501 A | 6/2020 |

* cited by examiner

FIG. 6
Comparative Example

DISPLAY DEVICE WITH ALTERNATING POWER AND DATA LINES

This application claims priority to Korean Patent Application No. 10-2020-0168717, filed on Dec. 4, 2020, and all the benefits accruing therefrom under 35 U.S.C. § 119, the content of which in its entirety is herein incorporated by reference.

BACKGROUND

1. Field

One or more embodiments relate to a display device, and more particularly, to a display device capable of displaying a high-quality image.

2. Description of the Related Art

A display device has display areas, and many pixels are in the display areas. Data lines are electrically connected to the pixels, and the pixels emit light having luminance corresponding to electrical signals transmitted from the data lines.

SUMMARY

However, in an existing display device, there is a problem that the luminance of an image displayed on a display area may not be unintentionally constant.

In order to solve various problems including the above problem, one or more embodiments include a display device capable of displaying a high-quality image. However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments of the disclosure.

According to one or more embodiments, a display device includes a substrate including a display area and a peripheral area outside the display area, a power wiring portion including a first power line in the peripheral area, a second power line spaced apart from the first power line and closer to the display area than the first power line, and connection power lines connecting the first power line to the second power line, and data lines in the peripheral area and having portions located between the connection power lines when viewed from a direction perpendicular to the substrate.

The substrate may include a first area including the display area and a portion of the peripheral area adjacent to the display area, a second area including another portion of the peripheral area, and a bending area between the first area and the second area, wherein the substrate may be bent in the bending area.

The first power line may be located in the second area, the second power line may be located in the first area, and the connection power lines may cross the bending area.

The connection power lines and the data lines may be alternately located.

The number of connection power lines located between two neighboring data lines may be constant.

A distance between portions of the data lines located between the connection power lines may be constant.

Each of the data lines may include a first data line in the peripheral area, a second data line spaced apart from the first data line and closer to the display area than the first data line, and a connection data line connecting the first data line to the second data line.

When viewed from the direction perpendicular to the substrate, the connection data line may be located between the connection power lines.

The connection power lines and connection data lines included in the data lines may be alternately located.

The number of connection power lines located between two neighboring connection data lines among connection data lines included in the data lines may be constant.

A distance between the connection data lines may be constant.

The substrate may include a first area including the display area and a portion of the peripheral area adjacent to the display area, a second area including another portion of the peripheral area, and a bending area located between the first area and the second area, wherein the substrate may be bent in the bending area.

The first power line and the first data line may be located in the second area, the second power line and the second data line may be located in the first area, and the connection power lines and the connection data line may cross the bending area.

The connection data lines and the connection power line may be disposed on a same layer.

The connection data lines may include a material included in the connection power lines.

The connection data lines and the connection power lines may include a same layered structure.

The connection data line may be disposed on a layer covering the first data line and the second data line, and may be electrically connected to the first data line and the second data line through contact holes, respectively.

The display device may further include a semiconductor layer located in the display area, a gate electrode disposed over the semiconductor layer, and a metal layer disposed over the gate electrode, wherein the first data line, the second data line, and the gate electrode may be disposed on a first layer, and the connection data line and the metal layer may be disposed on a second layer.

The connection power lines may be disposed on the second layer.

The first power line, the second power line, and the connection power lines may be integrally formed as a single body.

Other aspects, features, and advantages than the above-described aspects, features, and advantages will be apparent from a detailed description, the claims, and the drawings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Since the disclosure may have diverse modified embodiments, preferred embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

One or more embodiments of the disclosure will be described below in more detail with reference to the accompanying drawings. Those components that are the same or are in correspondence are rendered the same reference numeral regardless of the figure number, and redundant explanations are omitted. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will be understood that when a layer, region, or component is referred to as being "formed on," another layer, region, or component, it can be directly or indirectly formed on the other layer, region, or component. That is, for example, intervening layers, regions, or components may be present. Sizes of elements in the drawings may be exaggerated for convenience of explanation. For example, since sizes and thicknesses of components in the drawings are arbitrarily illustrated for convenience of explanation, the following embodiments are not limited thereto.

In the following embodiments, the X-axis, the Y-axis and the Z-axis are not limited to three axes of the rectangular coordinate system, and may be interpreted in a broader sense. For example, the X-axis, the Y-axis, and the Z-axis may be perpendicular to one another, or may represent different directions that are not perpendicular to one another.

Figure 1:
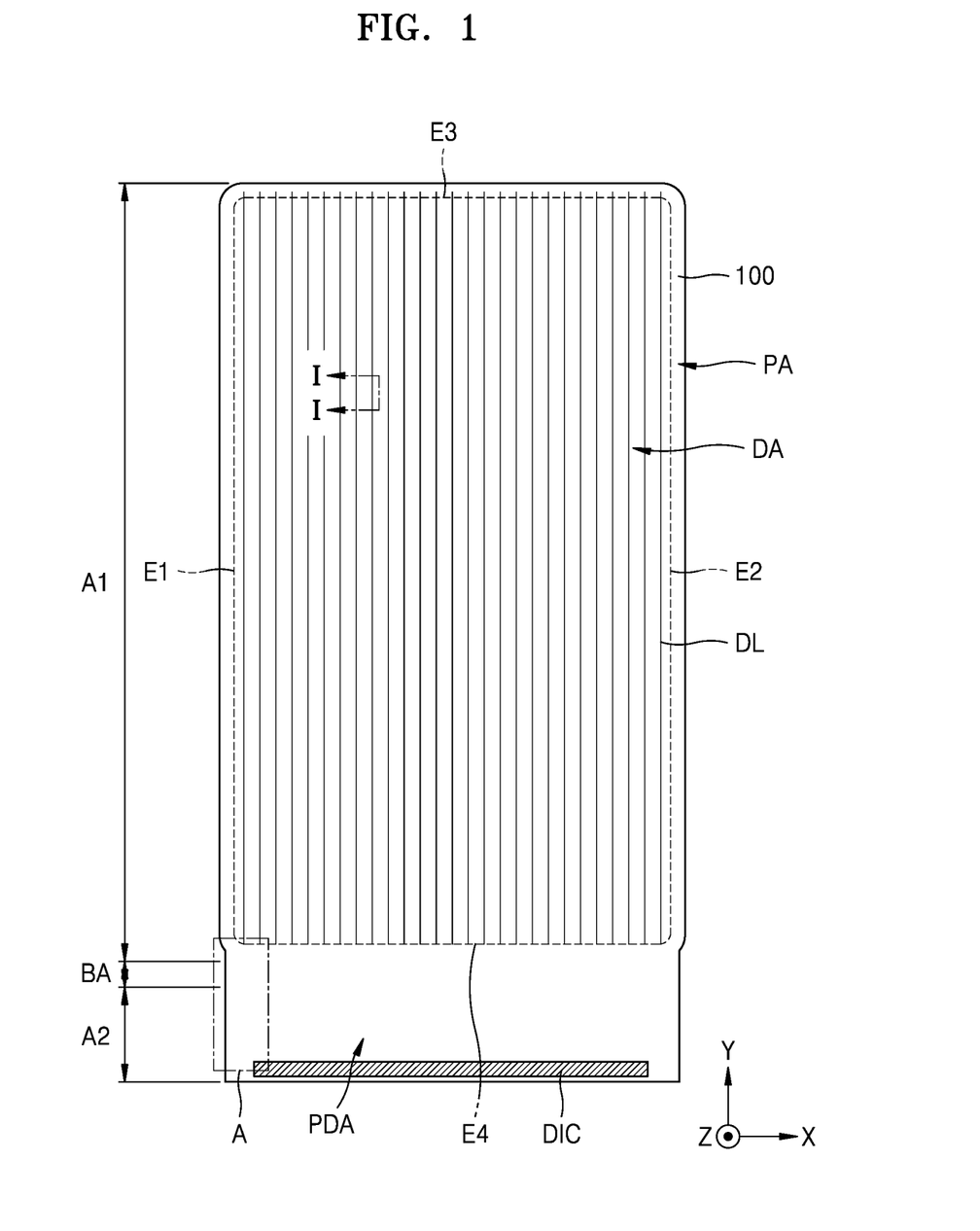
FIG. 1 is a schematic plan view of a portion of a display device according to an embodiment.
Figure 2:
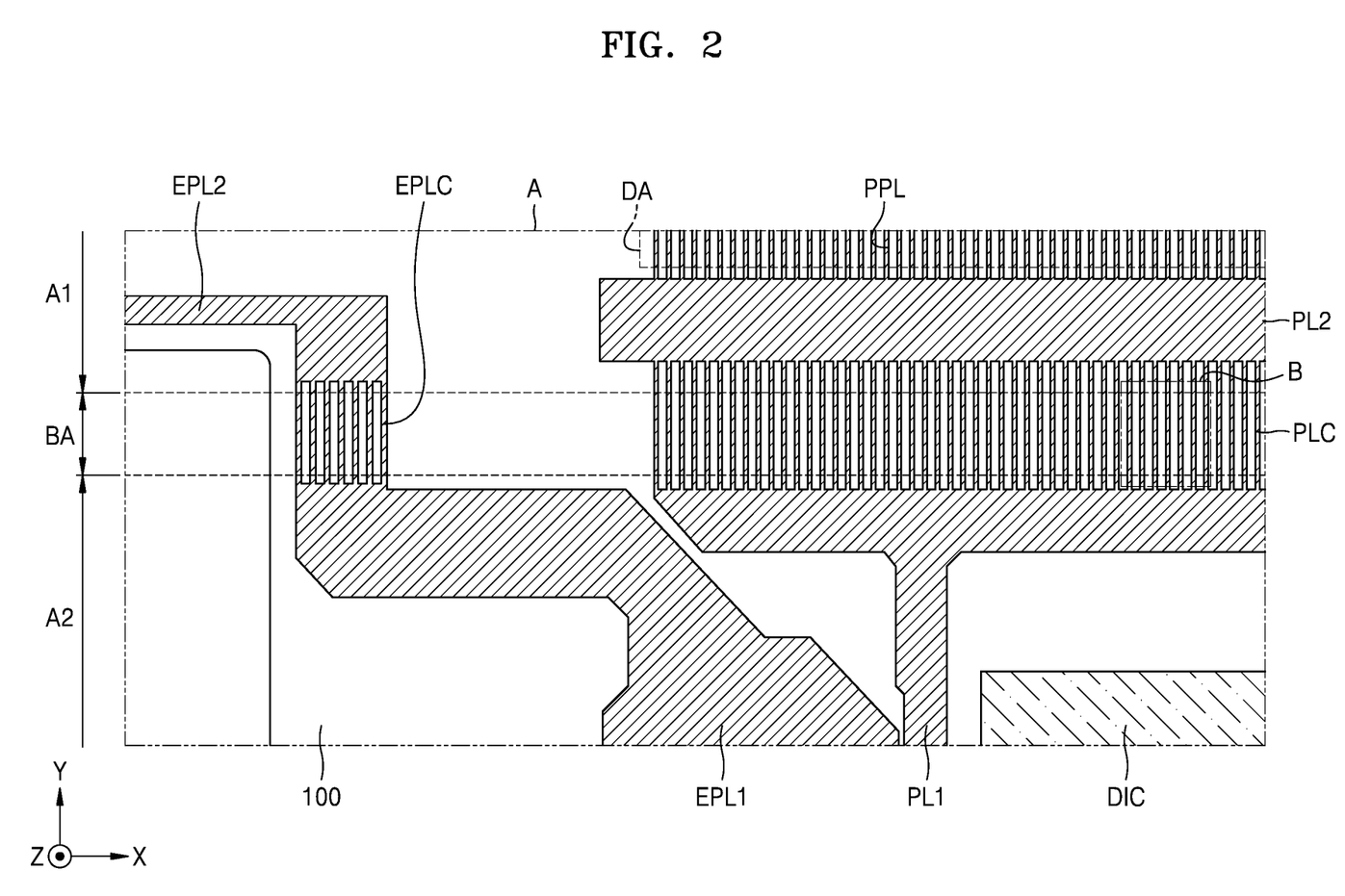
FIG. 2 is a schematic plan view of a portion of a region A of FIG. 1.
Figure 3:
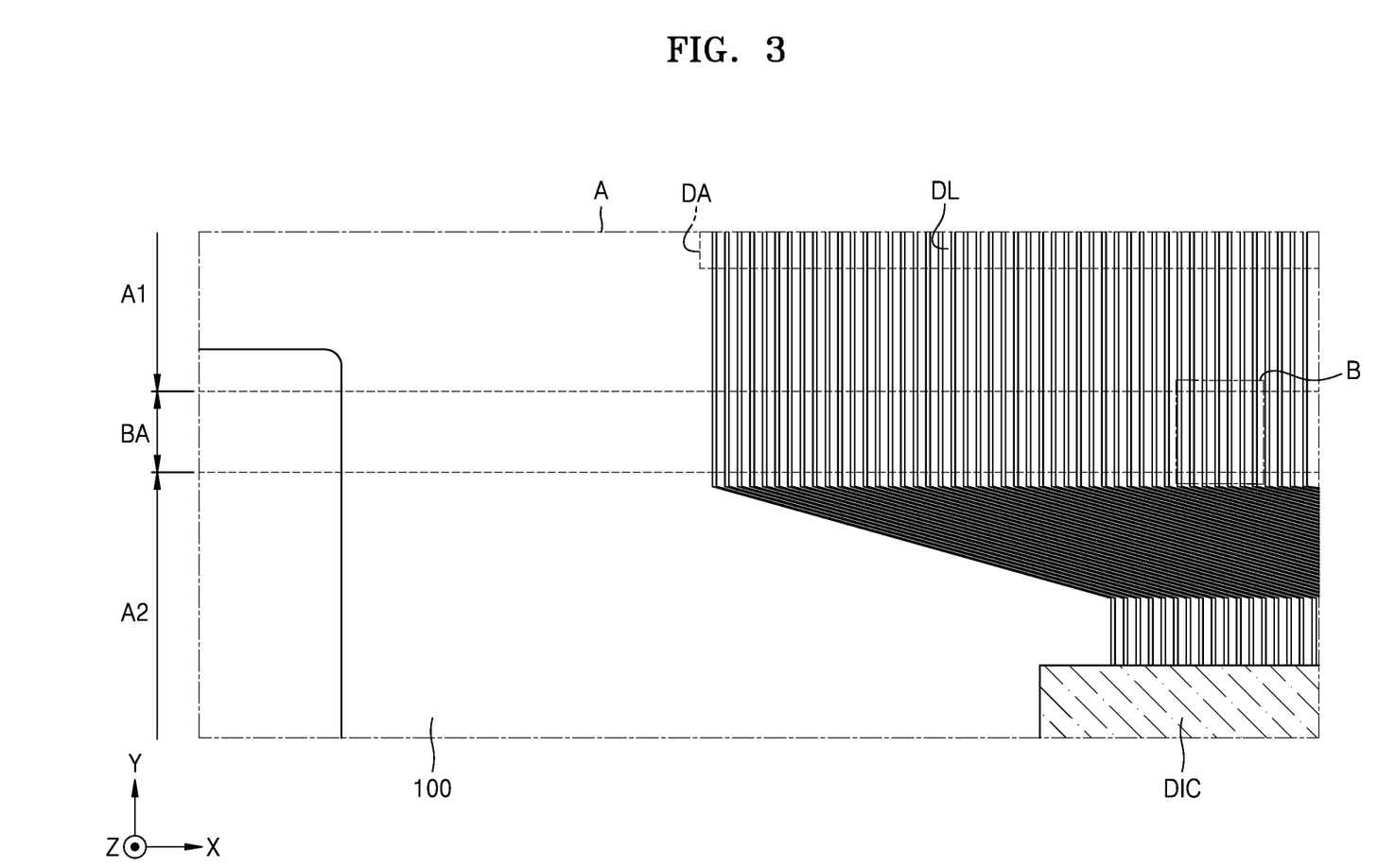
FIG. 3 is a schematic plan view of another portion of a region A of FIG. 1.
Figure 4:
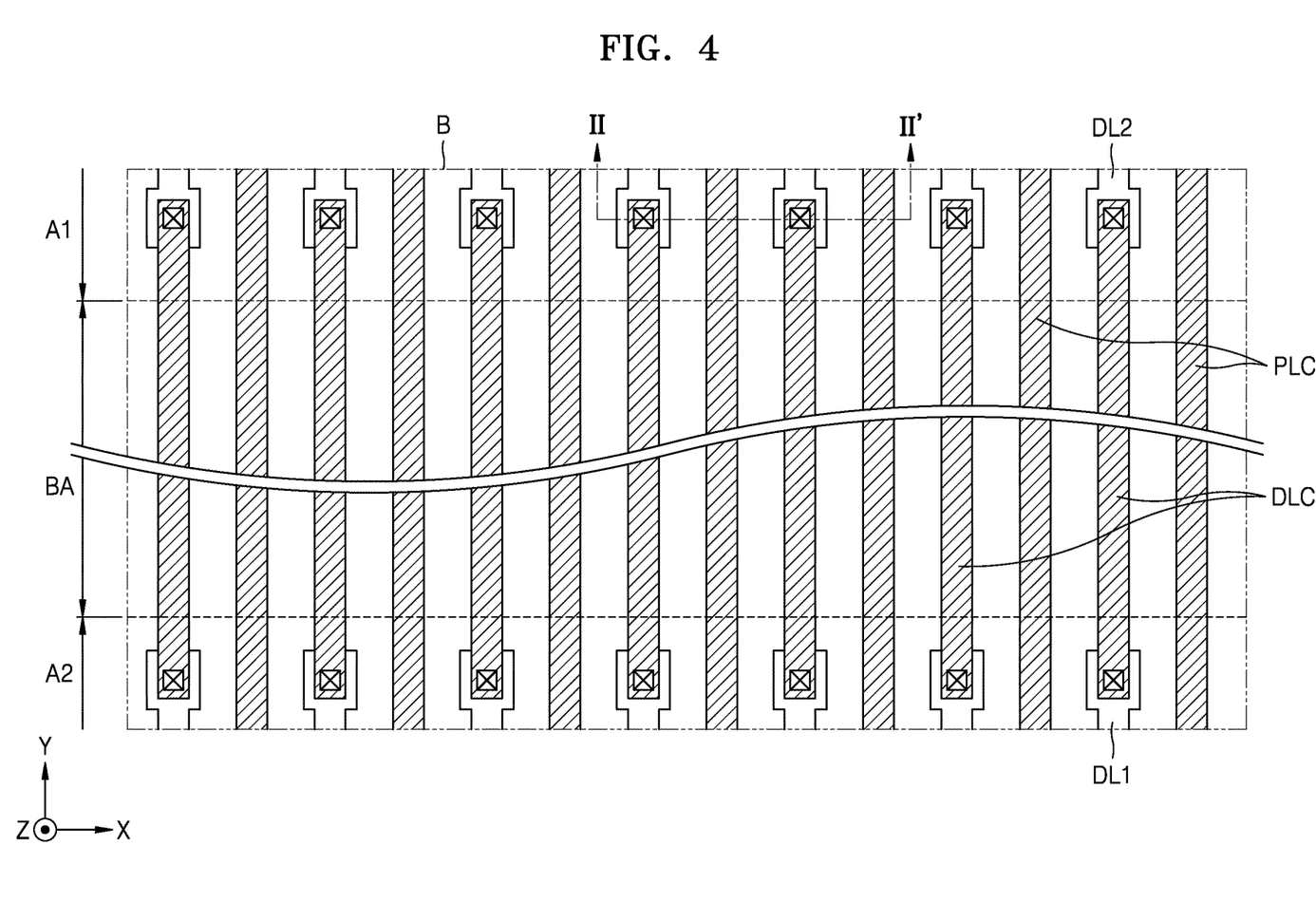
FIG. 4 is a schematic plan view of a region B of FIGS. 2 and 3.

FIG. 1 is a schematic plan view of a portion of a display device according to an embodiment, FIG. 2 is a schematic plan view of a portion of a region A of FIG. 1, FIG. 3 is a schematic plan view of another portion of a region A of FIG. 1, and FIG. 4 is a schematic plan view of a region B of FIGS. 2 and 3. For reference, FIGS. 2 and 3 are plan views illustrating an enlarged lower left portion of the display device of FIG. 1. When FIGS. 2 and 3 are inverted around the Y-axis, plan views illustrating an enlarged lower right portion of the display device of FIG. 1 are obtained.

As shown in FIG. 1, the display device according to the present embodiment has a display area DA in which a plurality of pixels are located, and a peripheral area PA located outside the display area DA. It may be understood that a substrate 100 included in the display device has the display area DA and the peripheral area PA. The peripheral area PA includes a pad area PDA, which is an area to which a printed circuit board or electronic devices such as various driving circuits DIC are electrically attached. As shown in FIG. 1, the substrate 100 included in the display device according to the present embodiment includes a first area A1, a second area A2, and a bending area BA between the first area A1 and the second area A2.

It may be understood that FIG. 1 is a plan view showing a state of a substrate or the like during a manufacturing process. In an electronic device such as a final display device or a smartphone including a display device, a portion of a substrate or the like may be bent to reduce the area of the peripheral area PA recognized by a user in a plan view. For example, the peripheral area PA may include a bending area BA, and the bending area BA may be located between the pad area PDA and the display area DA. In this case, the substrate 100 may be bent in the bending area BA, and accordingly at least a portion of the pad area PDA may overlap the display area DA in a plan view. In this case, a bending direction is set so that the pad area PDA does not cover the display area DA but is located behind the display area DA. Accordingly, the user in a plan view recognizes that the display area DA occupies most of the display device.

The substrate 100 may include various flexible or bendable materials. For example, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multi-layered structure, and may include two layers including the polymer resin and a barrier layer including an inorganic material (e.g., silicon oxide, silicon nitride, and silicon oxynitride) between the two layers. The structure of the substrate 100 may be variously modified. Furthermore, in a case that the substrate 100 is not bendable, the substrate 100 may include glass or the like.

The edge of the display area DA may have a shape similar to a rectangle or a square as a whole. For example, as shown in FIG. 1, the display area DA may have a first edge E1 and a second edge E2 extending in a longitudinal direction (e.g., y-axis direction) of the display device, and which face each other, and a third edge E3 and a fourth edge E4 extending in a latitudinal direction (e.g., x-axis direction) of the display device, and which face each other and are between the first edge E1 and the second edge E2. The pad area PDA is adjacent to the fourth edge E4 of the first to fourth edges E1 to E4.

The display device according to the present embodiment includes a power wiring portion as shown in FIG. 2 and data lines DL as shown in FIG. 3. FIGS. 2 and 3 illustrate the same area (i.e., the region A of FIG. 1) of the display device according to the present embodiment, and it may be understood that FIGS. 2 and 3 illustrate different components located in the same area when viewed from a direction perpendicular to the substrate 100, i.e., in a plan view.

The power wiring portion may include a first power line PL1, a second power line PL2, and connection power lines PLC. The first power line PL1 is located in the peripheral area PA. In more detail, the first power line PL1 may be located near the pad area PDA. The second power line PL2 is also located in the peripheral area PA, and is apart from the first power line PL1. The second power line PL2 is located closer to the display area DA than the first power line PL1. The connection power lines PLC connect the first power line PL1 to the second power line PL2. The first power line PL1, the second power line PL2, and the connection power lines PLC may be formed of the same material at the same time and may be integral (i.e., monolithic). A plurality of pixel power lines PPL (extending in a Y-axis direction) may be connected to the second power line PL2. The pixel power lines PPL that can be called ELVDD extend into the display area DA. Each of the pixel power lines PPL may be electrically connected to display elements of a corresponding column in the display area DA and apply power to the display elements.

The data lines DL are also located in the peripheral area PA. In this case, when viewed from a direction perpendicular to the substrate 100, i.e., in a plan view, the data lines DL have portions located between the connection power lines PLC. Furthermore, the connection power lines PLC and the data lines DL may be alternately located as shown in FIG. 4.

As shown in FIG. 4, each of the data lines DL may include a first data line DL1, a second data line DL2, and a connection data line DLC. The first data line DL1 is located in the peripheral area PA. In more detail, the first data line DL1 may be located near the pad area PDA. The second data line DL2 is also located in the peripheral area PA, and is apart from the first data line DL1. The second data line DL2 is located closer to the display area DA than the first data line DL1. Connection data lines DLC connect the first data line DL1 to the second data line DL2. Second data lines DL2 extend into the display area DA. Each of the second data lines DL2 may be electrically connected to display elements of a corresponding column in the display area DA and apply data to the display elements.

When viewed from a direction perpendicular to the substrate 100, i.e., in a plan view, the data lines DL have portions located between the connection power lines PLCs, as described above. Specifically, when viewed from a direction perpendicular to the substrate 100, the connection data lines DLC of the data lines DL are between the connection power lines PLC. The connection power lines PLC and the connection data lines DLC may be alternately located in the X-axis direction as shown in FIG. 4. Accordingly, in a direction (the X-axis direction) intersecting with a direction (the Y-axis direction) in which the connection data lines DLC extend, a distance between the neighboring connection data lines DLC may be kept constant.

The connection data lines DLC and the connection power lines PLC may be disposed on the same layer. Accordingly, in a manufacturing process, the connection data lines DLC may be simultaneously formed of the same material as the connection power lines PLC. As a result, the connection data lines DLC may include a material included in the connection power lines PLC, and a layered structure of the connection data lines DLC may be the same as a layered structure of the connection power lines PLC. In an embodiment, for example, the connection data lines DLC and the connection power lines PLC may each have a three-layered structure of titanium (Ti)/aluminum (Al)/titanium (Ti).

Each of the connection data lines DLC may be located on a layer covering the first data line DL1 and the second data line DL2, as shown in FIG. 4. In addition, the connection data line DLC may be electrically connected to the first data line DL1 and the second data line DL2 through contact holes defined in the layer. That is, one end of the connection data line DLC (in −Y direction) may be connected to the first data line DL1 through a contact hole, and the other end of the connection data line DLC (in +Y direction) may be connected to the second data line DL2 through another contact hole. Accordingly, the first data line DL1 and the second data line DL2 may be electrically connected to each other by the connection data line DLC.

Figure 5:
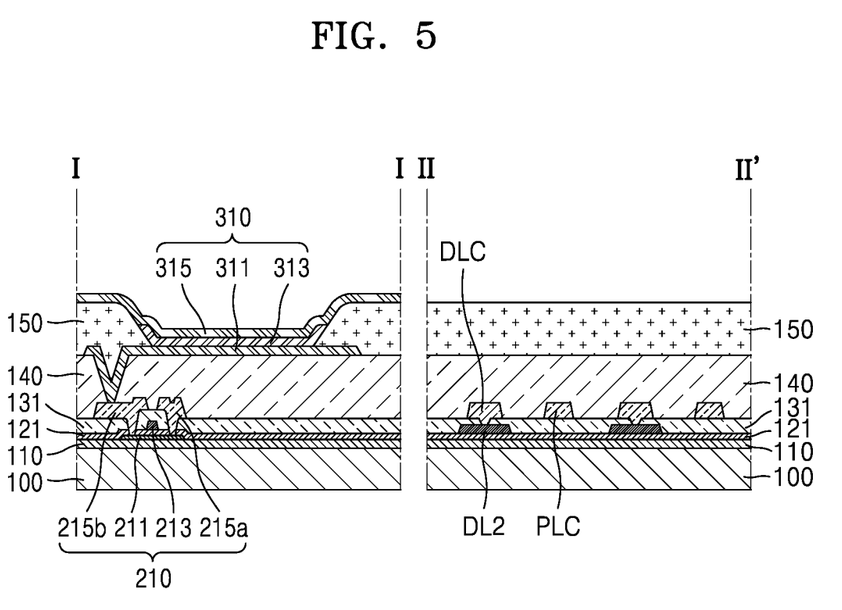
FIG. 5 is a schematic cross-sectional view of the display device taken along line I-I of FIG. 1 and line II-II' of FIG. 4.

FIG. 5 is a schematic cross-sectional view of the display device taken along line I-I of FIG. 1 and line II-II' of FIG. 4. As shown in FIG. 5, the display device according to the present embodiment includes a display element such as an organic light-emitting element 310 located in the display area DA, and a thin-film transistor 210 located in the display area DA and electrically connected to the organic light-emitting element 310 to control whether the organic light-emitting element 310 emits light or the degree of light emission of the organic light-emitting element 310. That the organic light-emitting element 310 is electrically connected to the thin-film transistor 210 may be understood as that a pixel electrode 311 of the organic light-emitting element 310 is electrically connected to the thin-film transistor 210.

The thin-film transistor 210 may include a semiconductor layer 211, a gate electrode 213, a source electrode 215a, and a drain electrode 215b. The semiconductor layer 211 may include amorphous silicon, polycrystalline silicon, or an organic semiconductor material. The gate electrode 213 may include various conductive materials and may have various layered structures. For example, the gate electrode 213 may include a molybdenum (Mo) layer and an Al layer. The source electrode 215a and the drain electrode 215b may also include various conductive materials and may have various layered structures. For example, the source electrode 215a and the drain electrode 215b may each include a Ti layer and an Al layer.

In order to secure insulation between the semiconductor layer 211 and the gate electrode 213, a gate insulating layer 121 may be disposed between the semiconductor layer 211 and the gate electrode 213. The gate insulating layer 121 may include an inorganic material such as silicon oxide, silicon nitride, and/or silicon oxynitride. In addition, an interlayer-insulating layer 131 may be arranged on the gate electrode 213, and the source electrode 215a and the drain electrode 215b may be arranged on the interlayer-insulating layer 131. The interlayer-insulating layer 131 may include an inorganic material such as silicon oxide, silicon nitride, and/or silicon oxynitride. An insulating layer including an inorganic material may be formed through chemical vapor deposition ("CVD") or atomic layer deposition ("ALD"). This is also the same in the following embodiments and variations thereof.

In an embodiment, the source electrode 215a and the drain electrode 215b may not serve as electrodes, but may be simple metal layers. For example, a predetermined portion of the semiconductor layer 211 may be doped to serve as a source electrode or a drain electrode. In this case, it may be understood that the source electrode 215a or the drain electrode 215b as shown in FIG. 5 is a connection electrode electrically connecting the semiconductor layer 211 to other components. Alternatively, the source electrode 215a or the drain electrode 215b as shown in FIG. 5 may be a portion of a wiring, and may be modified in various ways, such as not be in contact with the semiconductor layer 211 as desired. In this sense, the source electrode 215a or the drain electrode 215b may be referred to as a metal layer located in the display area DA. This is also the same in the following embodiments and variations thereof.

A buffer layer 110 may be disposed between the thin-film transistor 210 and the substrate 100. The buffer layer 110 may include an inorganic material such as silicon oxide, silicon nitride, and/or silicon oxynitride. The buffer layer 110 may increase the smoothness of the upper surface of the substrate 100 or prevent or reduce impurities from the substrate 100 from penetrating into the semiconductor layer 211 of the thin-film transistor 210.

In addition, a planarization layer 140 may be arranged on the thin-film transistor 210. For example, when the organic light-emitting element 310 is arranged on the thin-film transistor 210 as shown in FIG. 5, the planarization layer 140 may substantially planarize an upper portion of a protective layer covering the thin-film transistor 210. The planarization layer 140 may include an organic material such as acrylic, benzocyclobutene ("BCB"), or hexamethyldisiloxane ("HMDSO"). In FIG. 5, the planarization layer 140 is illustrated as a single layer. However, the planarization layer 140 may include multiple layers, and may be variously modified.

A display element may be located on the planarization layer 140 in the display area DA of the substrate 100. In FIG. 5, the organic light-emitting element 310 as a display element is illustrated to be located on the planarization layer 140. The organic light-emitting element 310 may include the pixel electrode 311, an opposite electrode 315, and an intermediate layer 313 therebetween and including an emission layer. The pixel electrode 311 is electrically connected to the thin-film transistor 210 by making contact with one of the source electrode 215a and the drain electrode 215b through an opening formed in the planarization layer 140 or the like, as shown in FIG. 5.

A pixel-defining layer 150 may be arranged on the planarization layer 140. The pixel-defining layer 150 has an opening corresponding to each subpixel, that is, an opening through which at least a central portion of the pixel electrode 311 is exposed, and defines a pixel. In addition, as shown in FIG. 5, the pixel-defining layer 150 prevents arcs or the like from occurring at the edge of the pixel electrode 311 by increasing the distance between the pixel electrode 311 and the opposite electrode 315. The pixel-defining layer 150 may include an organic material such as polyimide or HMDSO.

The intermediate layer 313 of the organic light-emitting element 310 may include a low molecular weight or high molecular weight material. When the intermediate layer 313 includes a low molecular weight material, the intermediate layer 313 may have a structure in which a hole injection layer ("HIL"), a hole transport layer ("HTL"), an emission layer ("EML"), an electron transport layer ("ETL"), an electron injection layer ("EIL"), etc. are stacked in a single or complex structure, and may be formed by a vacuum deposition method. When the intermediate layer 313 includes a high molecular weight material, the intermediate layer 313 may have a structure including an HTL and an EML. In this case, the HTL may include PEDOT, and the EML may include a polymer material such as poly-phenylenevinylene ("PPV") and polyfluorene. The intermediate layer 313 may be formed by screen printing, inkjet printing, laser induced thermal imaging ("LITI"), or the like. The intermediate layer 313 is not necessarily limited thereto and may have various structures. In addition, the intermediate layer 313 may include a layer integrally formed over a plurality of pixel electrodes 311 or may include a layer patterned to correspond to each of the plurality of pixel electrodes 311.

The opposite electrode 315 is arranged above the display area DA, and may cover the display area DA. That is, the opposite electrode 315 may be integrally formed in a plurality of organic light-emitting elements and may correspond to the plurality of pixel electrodes 311.

The opposite electrode 315 covers the display area DA and extends to the peripheral area PA outside the display area DA. In this case, the opposite electrode 315 is electrically connected to an electrode power line located in the peripheral area PA. The electrode power line is also called ELVSS.

In FIG. 2, the electrode power line is illustrated to include a first electrode power line EPL1, a second electrode power line EPL2, and connection electrode power lines EPLC. The first electrode power line EPL1 is located in the peripheral area PA. Specifically, the first electrode power line EPL1 may be located near the pad area PDA (refer to FIG. 1). The second electrode power line EPL2 is also located in the peripheral area PA, and is apart from the first electrode power line EPL1. The second electrode power line EPL2 is located closer to the display area DA than the first electrode power line EPL1. The connection electrode power lines EPLC connect the first electrode power line EPL1 to the second electrode power line EPL2. The first electrode power line EPL1, the second electrode power line EPL2, and the connection electrode power lines EPLC may be formed of the same material at the same time and may be integral.

The second electrode power line EPL2 may extend along the display area DA outside the display area DA. For example, the second electrode power line EPL2 may extend along the first edge E1 as shown in FIG. 1 and be bent, and then may extend along the third edge E3. The second electrode power line EPL2 may be bent again and extend along the second edge E2. The opposite electrode 315 may extend outside the display area DA, and may be electrically connected to the second electrode power line EPL2 and receive an electric signal from the second electrode power line EPL2.

Because such an organic light-emitting element may be easily damaged by moisture or oxygen from the outside, an encapsulation layer (not shown) may cover the organic light-emitting element to protect the organic light-emitting element. The encapsulation layer may cover the display area DA and extend to at least a portion of the peripheral area PA.

The encapsulation layer may include a first inorganic encapsulation layer, an organic encapsulation layer, and a second inorganic encapsulation layer.

The first data line DL1 and the second data line DL2 as described above and the gate electrode 213 may be disposed on the same layer, and the connection data line DLC and a metal layer such as the source electrode 215a or the drain electrode 215b may be disposed on the same layer. In FIG. 5, it is shown that the second data line DL2 and the gate electrode 213 are disposed on the same layer and the connection data line DLC and a metal layer such as the source electrode 215a or the drain electrode 215b are disposed on the same layer. Accordingly, the second data line DL2 may have a three-layered structure including a Mo layer, an Al layer, and a Mo layer, like the gate electrode 213, and the connection data line DLC may have a three-layered structure including a Ti layer, an Al layer, and a Ti layer, like the metal layer such as the source electrode 215a or the drain electrode 215b. As shown in FIG. 5, the connection power line PLC may also be disposed on the same layer as the metal layer such as the source electrode 215a or the drain electrode 215b, and thus may have a three-layered structure including a Ti layer, an Al layer, and a Ti layer, like the metal layer such as the source electrode 215a or the drain electrode 215b.

Figure 6:
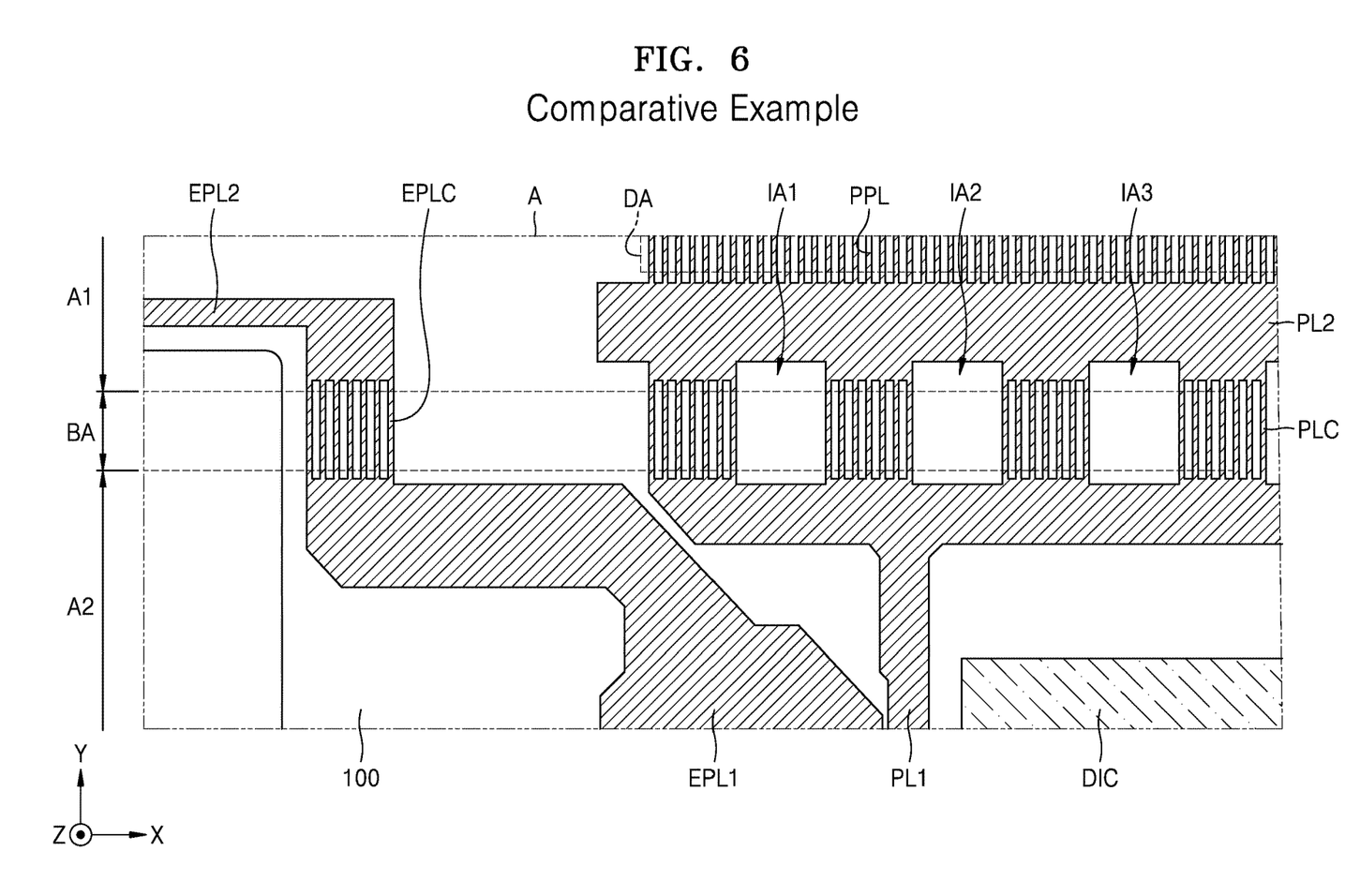
FIG. 6 is a schematic plan view of a portion of a display device according to a comparative example.

FIG. 6 is a schematic plan view of a portion of a display device according to a comparative example. In the display device according to the comparative example, connection power lines PLC connecting a first power line PL1 to a second power line PL2 are grouped. Accordingly, a first inter-area IA1 exists between a first group and a second group of the connection power lines PLC, a second inter-area IA2 exists between the second group and a third group of the connection power lines PLC, and a third inter-area IA3 exists between the third group and a fourth group of the connection power lines PLC. In addition, data lines are located in the first inter-area IA1, the second inter-area IA2, and the third inter-area IA3.

As shown in FIG. 3, because the data lines DL have a shape that spreads out from the driving circuit DIC, there is a difference between the lengths of the data lines DL in a portion between the driving circuit DIC and the display area DA. In the display device according to the comparative example shown in FIG. 6, data lines are located in the first inter-area IA1, the second inter-area IA2, and the third inter-area IA3. In this case, the length of a data line (hereinafter, referred to as a first column data line for convenience) disposed at the right end of the first inter-area IA1 in a direction (+X direction) toward the second inter-area IA2 from among data lines in the first inter-area IA1 may be different from the length of a data line (hereinafter, referred to as a second column data line for convenience) disposed at the left end of the second inter-area IA2 in a direction (−X direction) toward the first inter-area IA1 from among data lines in the second inter-area IA2. This is because a group of connection power lines PLC is disposed between the first column data line and the second column data line. Accordingly, the first column data line and the second column data line connected to two adjacent columns (extended in the Y direction) in the display area DA have a large voltage drop difference according to their own resistance.

Therefore, even though the same electrical signal is intended to be applied to a first column in the display area DA, which is connected to the first column data line, and a second column in the display area DA, which is connected to the second column data line, stripes due to a difference in luminance may be formed between the first column and the second column due to a large difference between the length of the first column data line and the length of the second column data line in the peripheral area PA, and, therefore, a user may visually recognize the stripes. For reference, there is a difference in length between the data lines arranged in the first inter-area IA1, but the difference in length is not large, and the lengths of the data lines arranged in the first inter-area IA1 increase or decrease at an approximately constant rate. Accordingly, stripes due to a difference in luminance are not visually recognized within a portion in the display area DA, which is connected to the data lines. The same applies to portions in the display area DA, which are connected to data lines arranged in another inter-area.

However, in the display device according to the present embodiment, as described above with reference to FIGS. 2 to 4, the connection power lines PLC are not grouped. In addition, the connection data lines DLC are disposed between the connection power lines PLC. Therefore, because a change in the length of the data line DL in the peripheral area PA increases or decreases at an approximately constant rate as shown in FIG. 3, stripes due to a difference in luminance do not occur in the display area DA. Accordingly, the display device according to the present embodiment may display a high-quality image.

Figure 7:
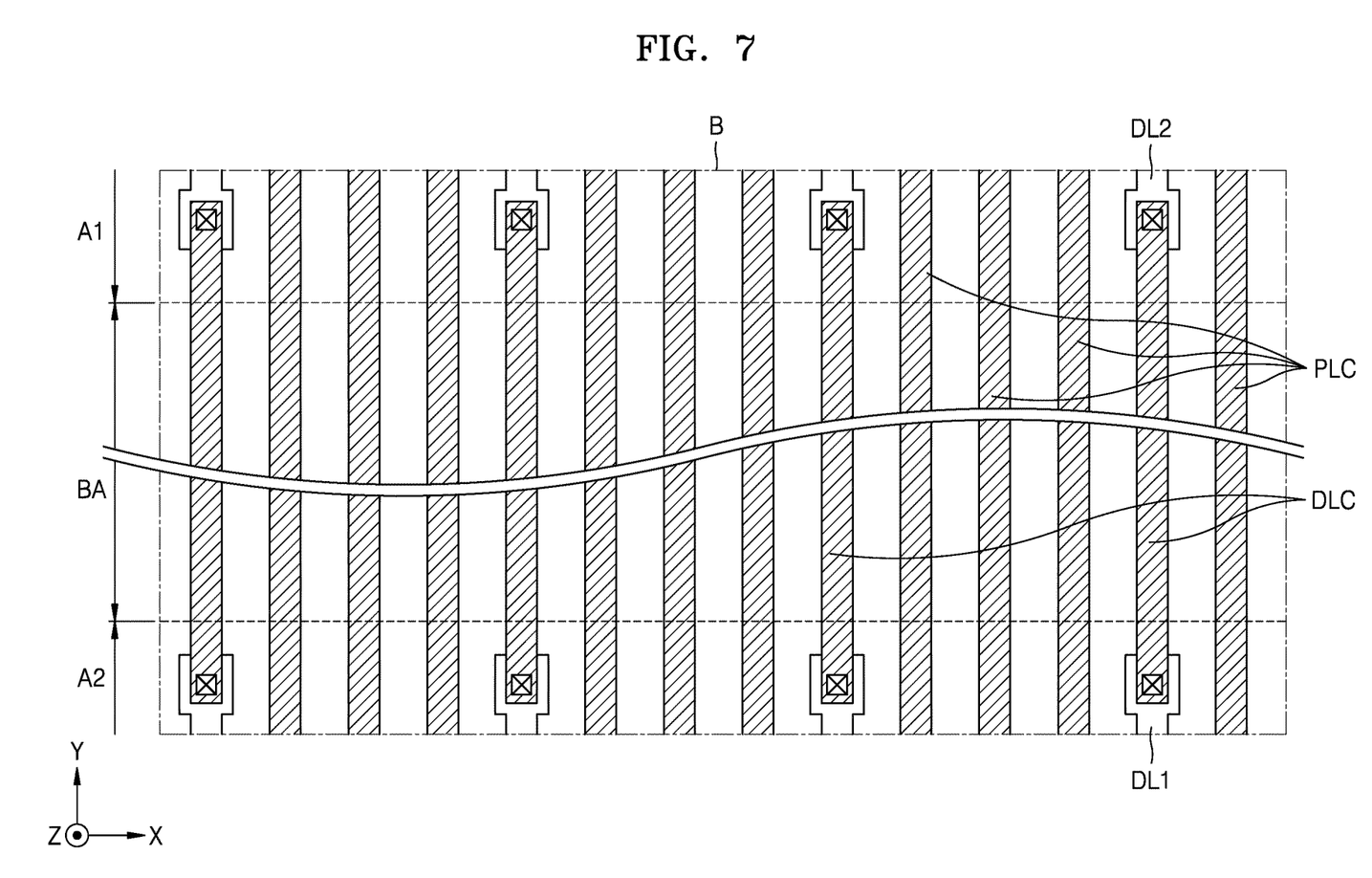
FIG. 7 is a schematic plan view of a portion of a display device according to another embodiment.

The change in the length of the data line DL in the peripheral area PA is sufficient if the change increases or decreases along X-axis direction at an approximately constant rate as shown in FIG. 3. Accordingly, as shown in FIG. 7, which is a schematic plan view of a portion of a display device according to another embodiment, the number of connection power lines PLC located between two neighboring data lines DL may be constant. That is, the number of connection power lines PLC located between the two neighboring connection data lines DLC adjacent to each other may be constant. In FIG. 7, it is shown that three connection power lines PLC are between adjacent connection data lines DLCs. Thus, the distance between the connection data lines DLC, that is, the distance between portions of a data line DL located between the connection power lines PLC, in the X-axis direction may be maintained approximately constant.

Figure 8:
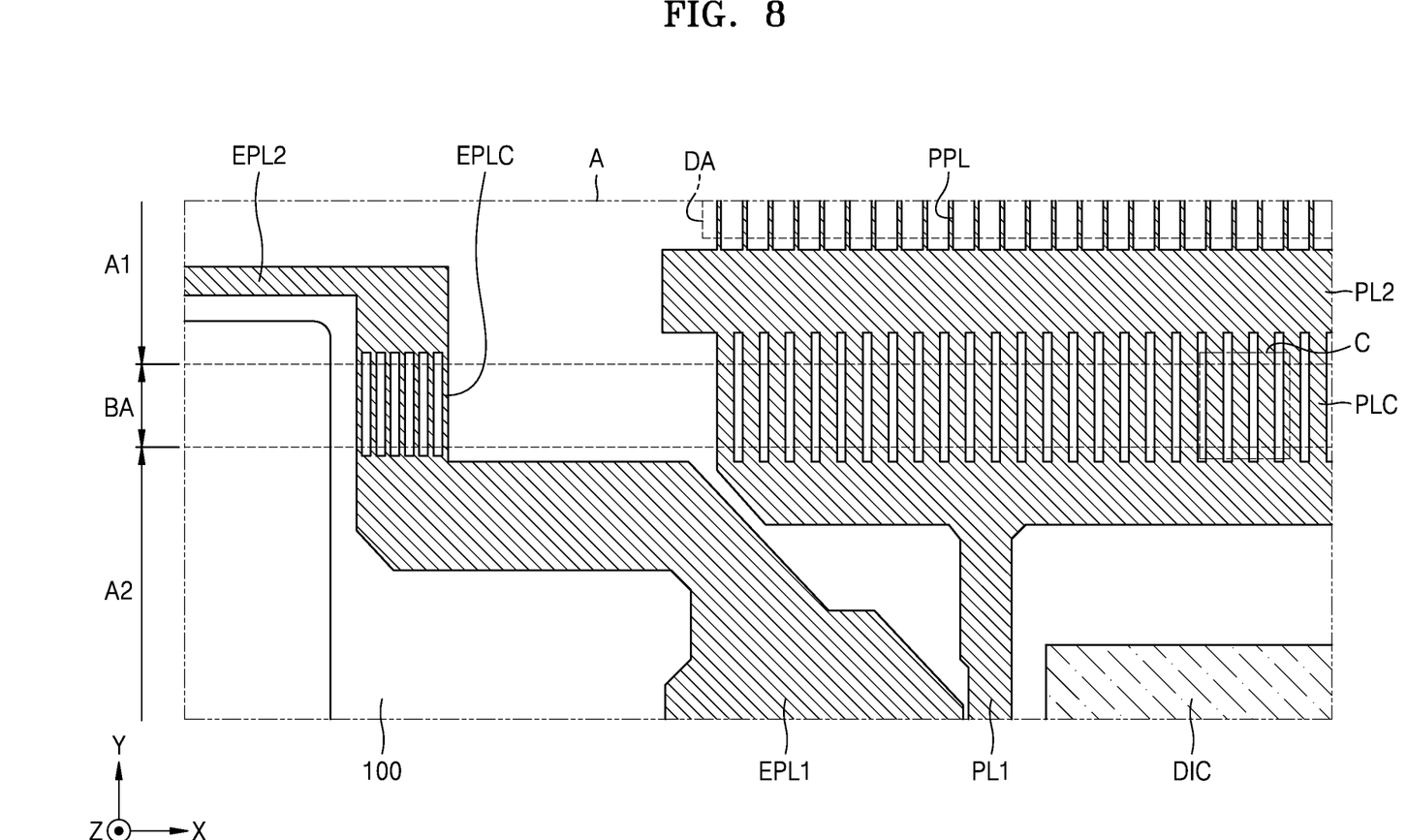
FIG. 8 is a schematic plan view of a portion of a display device according to another embodiment.
Figure 9:
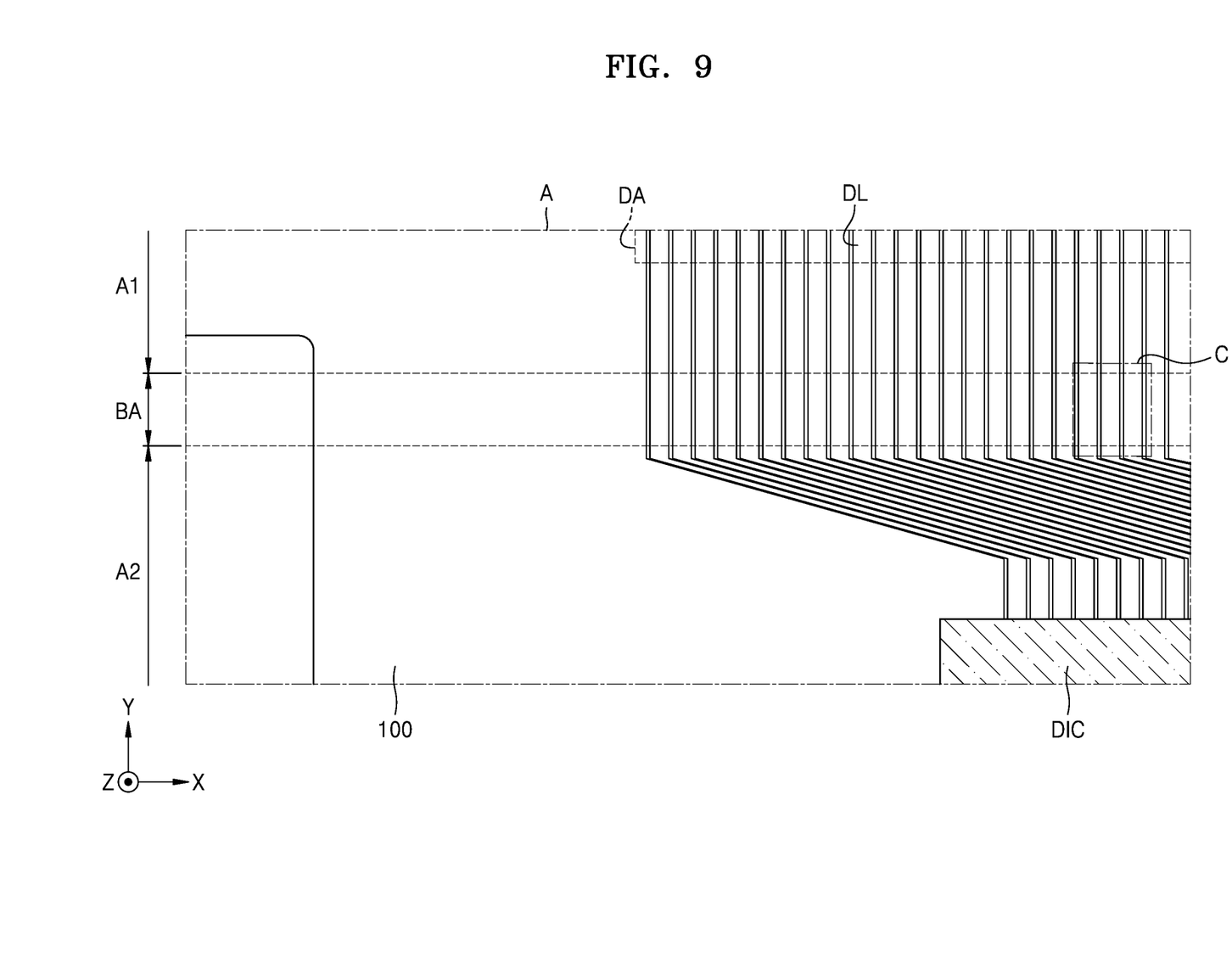
FIG. 9 is a schematic plan view of another portion of the display device shown in FIG. 8.
Figure 10:
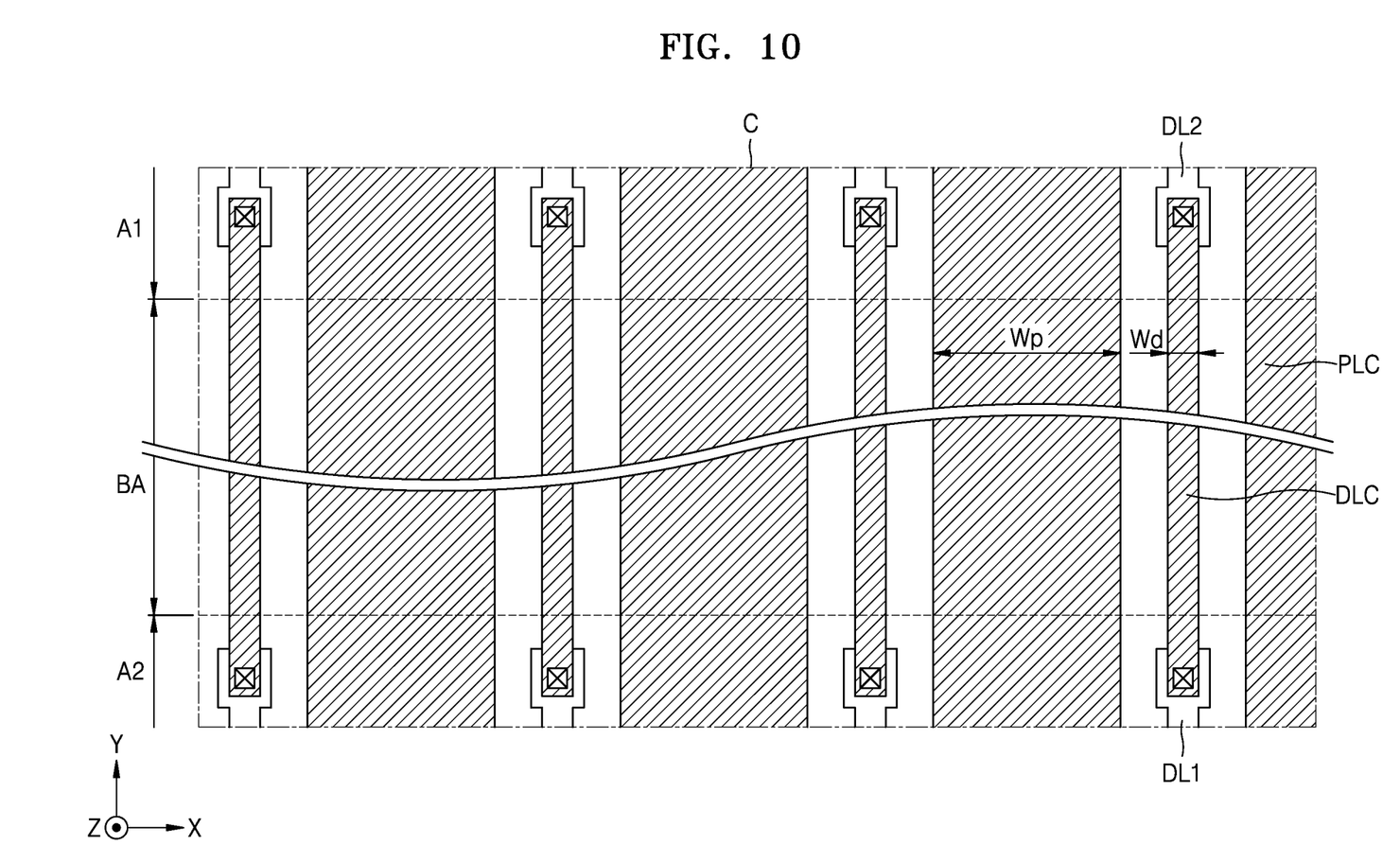
FIG. 10 is a schematic plan view of a region C of FIGS. 8 and 9.

FIG. 8 is a schematic plan view of a portion of a display device according to another embodiment, FIG. 9 is a schematic plan view of another portion of the display device shown in FIG. 8, and FIG. 10 is a schematic plan view of a region C of FIGS. 8 and 9.

As shown in the drawings illustrating the display device according to the above-described embodiments in FIGS. 4 and 7, the width of the connection power line PLC in the X-axis direction and the width of the connection data line DLC in the X-axis direction may be approximately similar to each other. However, the disclosure according to the invention is not limited thereto. For example, as shown in FIGS. 8 to 10, the width Wp of the connection power line PLC may be greater than the width Wd of the connection data line DLC in the X-axis direction. As a result, a voltage drop due to resistance in the connection power line PLC may be reduced, and a potential difference between the first power line PL1 and the second power line PL2 may be reduced. As shown in FIG. 8, a plurality of pixel power lines PPL extending in the Y-axis direction and facing the display area DA may be connected to the second power line PL2, and the width in the X-axis direction of each of the plurality of pixel power lines PPL may be less than the width Wp in the X-axis direction of the connection power line PLC. This is because the plurality of pixel power lines PPL are electrically connected to display elements of a corresponding column in the display area DA to apply power to the display elements.

Figure 11:
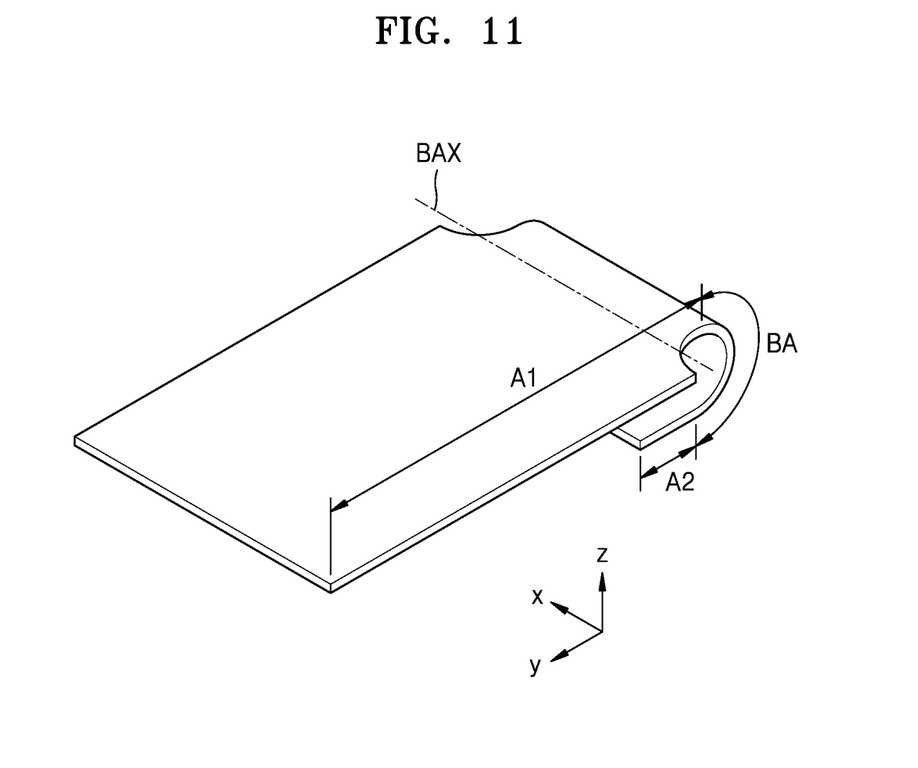
FIG. 11 is a schematic perspective view of a portion of a display device according to another embodiment.

FIG. 11 is a schematic perspective view of a portion of a display device according to another embodiment. As shown in FIG. 11, a substrate 100 included in the display device according to the present embodiment includes a first area A1, a second area A2, and a bending area BA between the first area A1 and the second area A2. The substrate 100 is bent about a bending axis BAX (parallel to the X-axis) in the bending area BA. In this way, the substrate 100 may be bent in the bending area BA, and accordingly at least a portion of a pad area PDA may overlap a display area DA. In this case, a bending direction is set so that the pad area PDA does not cover the display area DA but is located behind the display area DA. Accordingly, the user recognizes that the display area DA occupies most of the display device, and the area of a total dead space recognized by the user may be reduced.

The first area A1 may include a display area DA and a portion of a peripheral area PA adjacent to the display area DA, as shown in FIG. 1. In addition, the second area A2 may include another portion of the peripheral area PA, and the bending area BA may be between the first area A1 and the second area A2.

In this case, as shown in FIG. 2, a first power line PL1 may be located in the second area A2, a second power line PL2 may be located in the first area A1, and a connection power line PLC may cross the bending area BA. Because the substrate 100 is bent in the bending area BA, it is desirable to prevent disconnection of a wiring in the bending area BA. The display device according to the present embodiment may effectively prevent or reduce disconnection of the connection power lines PLC because the connection power lines PLC each having a relatively small width in the X-axis direction cross the bending area BA.

As shown in FIG. 3, a first data line DL1 may also be located in the second area A2, similar to the first power line PL1, and a second data line DL2 may also be located in the first area A1, similar to the second power line PL2. In addition, connection data lines DLC may cross the bending area BA, similar to the connection power lines PLC. As shown in FIG. 2, a first electrode power line EPL1 may be located in the second area A2, a second electrode power line EPL2 may be located in the first area A1, and connection electrode power lines EPLC may cross the bending area BA. Because the substrate 100 is bent in the bending area BA, it is desirable to prevent disconnection of a wiring in the bending area BA. The display device according to the present embodiment may effectively prevent or reduce disconnection of the connection electrode power lines EPLC because the connection electrode power lines EPLC each having a relatively small width in the X axis direction cross the bending area BA. The connection electrode power lines EPLC may be located on the same layer as the connection data lines DLC and the connection power lines PLC. Accordingly, the connection electrode power lines EPLC, the connection data lines DLC, and the connection power lines PLC may include the same material and have the same layered structure.

According to one or more embodiments as described above, a display device on which a high-quality image may be displayed may be implemented. Obviously, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a substrate including a display area in which a plurality of pixels are located and a peripheral area outside the display area and including a bending area;
   a power wiring portion disposed in the peripheral area and including a first power line, a second power line spaced apart from the first power line and closer to the display area than the first power line, and connection power lines connecting the first power line to the second power line; and
   data lines in the peripheral area and having portions located between the connection power lines when viewed from a direction perpendicular to the substrate,
   wherein, in the bending area, each of the data lines has a width smaller than a width of each of two connection power lines adjacent to the each of the data lines in opposite sides thereof, respectively.

2. The display device of claim 1, wherein the substrate includes a first area including the display area and a portion of the peripheral area adjacent to the display area, a second area including another portion of the peripheral area, and a bending area between the first area and the second area, wherein the substrate is bent in the bending area.

3. The display device of claim 2, wherein the first power line is located in the second area, the second power line is located in the first area, and the connection power lines cross the bending area.

4. The display device of claim 1, wherein the connection power lines and the data lines are alternately located.

5. The display device of claim 1, wherein a distance between the portions of the data lines located between the connection power lines is constant.

6. The display device of claim 1, wherein each of the data lines includes a first data line in the peripheral area, a second data line spaced apart from the first data line and closer to the display area than the first data line, and a connection data line connecting the first data line to the second data line.

7. The display device of claim 6, wherein, when viewed from the direction perpendicular to the substrate, the connection data line is located between the connection power lines.

8. The display device of claim 7, wherein the connection power lines and connection data lines included in the data lines are alternately located.

9. The display device of claim 7, wherein a number of connection power lines located between two neighboring connection data lines among connection data lines included in the data lines is constant.

10. The display device of claim 7, wherein a distance between the connection data lines is constant.

11. The display device of claim 6, wherein the substrate includes a first area including the display area and a portion of the peripheral area adjacent to the display area, a second area including another portion of the peripheral area, and a bending area located between the first area and the second area, wherein the substrate is bent in the bending area.

12. The display device of claim 11, wherein the first power line and the first data line are located in the second area, the second power line and the second data line are located in the first area, and the connection power lines and the connection data lines cross the bending area.

13. The display device of claim 6, wherein the connection data lines and the connection power lines are disposed on a same layer.

14. The display device of claim 13, wherein the connection data lines include a material included in the connection power lines.

15. The display device of claim 13, wherein the connection data lines and the connection power lines include a structure having a same number of layers.

16. The display device of claim 6, wherein the connection data line is disposed on a layer covering the first data line and the second data line, and is electrically connected to the first data line and the second data line through contact holes, respectively.

17. The display device of claim 16, further comprising:
a semiconductor layer located in the display area;
a gate electrode disposed over the semiconductor layer; and
a metal layer disposed over the gate electrode,
wherein the first data line, the second data line, and the gate electrode are disposed on a first layer, and the connection data line and the metal layer are disposed on a second layer.

18. The display device of claim 17, wherein the connection power lines are disposed on the second layer.

19. The display device of claim 1, wherein the first power line, the second power line, and the connection power lines are integrally formed as a single body.

20. A display device comprising:
a substrate including a display area in which a plurality of pixels are located and
a peripheral area outside the display area and including a bending area;
a power wiring portion disposed in the peripheral area and including a first power line, a second power line spaced apart from the first power line and closer to the display area than the first power line, and connection power lines connecting the first power line to the second power line; and
data lines in the peripheral area and having portions located between the connection power lines when viewed from a direction perpendicular to the substrate,
wherein, in the bending, the data lines and the connection power lines are repeatedly arranged in an order of one data line, a certain plural number of connection power lines, one data line, and the certain plural number of connection power lines.

* * * * *